(12) United States Patent
Yang

(10) Patent No.: US 7,733,723 B2
(45) Date of Patent: Jun. 8, 2010

(54) SEMICONDUCTOR MEMORY DEVICE HAVING PRECHARGE SIGNAL GENERATOR AND ITS DRIVING METHOD

(75) Inventor: Sun-Suk Yang, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 96 days.

(21) Appl. No.: 11/819,570

(22) Filed: Jun. 28, 2007

(65) Prior Publication Data
US 2008/0074937 A1    Mar. 27, 2008

(30) Foreign Application Priority Data
Sep. 27, 2006   (KR) ...................... 10-2006-0094137

(51) Int. Cl.
*G11C 7/00* (2006.01)
*G11C 8/00* (2006.01)

(52) U.S. Cl. .................... 365/203; 365/194; 365/233.1; 365/233.11; 365/233.16

(58) Field of Classification Search ................. 365/203, 365/194, 189.05, 189.11, 233.1, 233.11, 365/233.12, 233.16, 233.17, 233.18
See application file for complete search history.

(56) References Cited

U.S. PATENT DOCUMENTS

| | | | |
|---|---|---|---|
| 6,434,082 B1 * | 8/2002 | Hovis et al. | 365/203 |
| 6,507,526 B2 * | 1/2003 | Ohtake | 365/203 |
| 6,661,721 B2 * | 12/2003 | Lehmann et al. | 365/203 |
| 7,057,951 B2 * | 6/2006 | Im et al. | 365/203 |
| 7,075,854 B2 * | 7/2006 | Lee et al. | 365/233.16 |
| 7,263,013 B2 * | 8/2007 | Kim | 365/203 |
| 7,355,912 B2 * | 4/2008 | Park et al. | 365/203 |
| 2007/0171763 A1 * | 7/2007 | Jung et al. | |

FOREIGN PATENT DOCUMENTS

JP     2006-228342 A     8/2006
KR    10-2001-0061377    7/2001

OTHER PUBLICATIONS

Korean Office Action, with English translation, issued in Korean Patent Application No. KR 10-2006-0094137, mailed May 27, 2008.
Korean Notice of Allowance issued in Korean Patent Application No. KR 10-2006-0094137 dated on Nov. 26, 2008.

* cited by examiner

*Primary Examiner*—Trong Phan
(74) *Attorney, Agent, or Firm*—IP & T Law Firm PLC

(57) ABSTRACT

A semiconductor memory device includes a drive clock supplier and a signal generator. The drive clock supplier supplies a drive clock which is obtained by dividing an internal clock with a divide ratio, wherein the drive clock synchronizes with a rising edge of the internal clock with which an internal write signal synchronizes. The signal generator counts time corresponding to a write-recovery on the basis of the drive clock, to generate a precharge signal.

25 Claims, 7 Drawing Sheets

US 7,733,723 B2

SEMICONDUCTOR MEMORY DEVICE HAVING PRECHARGE SIGNAL GENERATOR AND ITS DRIVING METHOD

CROSS-REFERENCE TO RELATED APPLICATION

The present invention claims priority of Korean patent application number 10-2006-0094137, filed on Sep. 27, 2006, which is incorporated by reference in its entirety.

BACKGROUND OF THE INVENTION

The present invention generally relates to semiconductor design technologies, and, more particularly, to a semiconductor memory device having a precharge signal generator capable of securing a timing margin in case of driving at a high frequency, without increase in its size and current consumption.

Generally, a write operation of a DRAM is performed by a write command and a write-precharge-command. Upon input of the write command, only the write operation is carried out, in which data is stored in a unit memory cell designated by a corresponding address. Meanwhile, upon input of the write-precharge-command, the write operation followed by an operation of precharging an activated word line is conducted. In addition, the write command and the write-precharge-command are distinguished from each other by a logic level of a specific address.

The following is a detailed description of a precharge signal generator for generating a precharge command to precharge a corresponding bank that becomes active by the write operation.

FIG. 1 is a block diagram showing a structure of a conventional precharge signal generator being used in a semiconductor memory device.

Referring to FIG. 1, the conventional precharge signal generator includes a clock buffer 10 for receiving an internal clock CLK and generating a pulse clock CLKP, a write interval signal generator 20 for producing a write interval signal T_APCG in response to a column address AY<8> and an internal write signal CASP6WT<0>, and a signal generator 30 for generating a precharge signal APCG<0> after a delay time corresponding to a write-recovery time in response to the write interval signal T_APCG.

For reference, the write interval signal generator 20 and the signal generator 30 are blocks which generate the precharge signal APCG<0> to precharge a word line activated within a first bank. As such, to generate a precharge signal APCG<0:3> for each bank in the device, the internal write signal CASP6WT, activated with bank information and write information, is applied to the write interval signal generator 20. That is, the conventional precharge signal generator is provided with plural write interval signal generators and signal generators for precharging each bank within the semiconductor memory device, and precharges a specific bank in response to an activation of a corresponding signal out of a plurality of internal write signals CASP6WT<0:3>, which is activated depending on the bank information.

Further, the write-recovery time used herein is the time that elapses after the inflow of data stored in a cell into a bit line sense amplifier (which amplifies the input data) (not shown) until an update of the cell with data from outside in the bit line sense amplifier by an activation of a corresponding word line. This write-recovery time is decided by setting a write-recovery-information signal TWR<3:5> upon an initial operation. For example, if the write-recovery time is 3, the write-recovery-information signal TWR<3> is activated to a logic high level and the other signals TWR<4> and TWR<5> are inactivated to a logic low level.

In succession, if the column address AY<8> has a logic high level, this implies that the write-precharge-command is applied, and if the column address AY<8> has a logic low level, this implies that the write command is applied.

Meanwhile, the signal generator 30 is embodied by a multiplicity of shifters which delay the write interval signal T_APCG for a delay time corresponding to the write-recovery-information signal TWR<3:5>.

FIG. 2 is a waveform diagram describing the operation of the conventional precharge signal generator shown in FIG. 1.

First, a write-precharge-command WTWAP<0> is applied and its corresponding data is then received from outside. When the reception of the data is completed, the internal write signal CASP6WT<0> is activated in synchronization with the pulse clock CLKP.

Then, the write interval signal generator 20 activates the write interval signal T_APCG in response to the internal write signal CASP6WT<0> and the column address AY<8>.

Next, the signal generator 30 activates the precharge signal APCG<0> in synchronization with a rising edge of the pulse clock CLKP after a delay time corresponding to the write-recovery-information signal TWR<3:5>, starting from the activation time of the write interval signal T_APCG. At this time, the time corresponding to the write-recovery-information signal TWR<3:5> is counted by the pulse clock CLKP outputted from the clock buffer 10. For reference, it is assumed that the write-recovery time is set to 3 clocks and thus the write-recovery-information signal TWR<3> is activated.

On the other hand, as for a case where a write-precharge-command WTWAP<1> is applied for making a second bank active, the operation is performed in the same way, and therefore, details thereof are omitted here for simplicity.

As mentioned above, upon application of the write-command with precharge information, the conventional precharge signal generator in the semiconductor memory device counts a delay time corresponding to an internal latency and a write-recovery on the basis of the pulse clock with the same frequency as the internal clock, and thereafter generates the precharge signal. Thus, the more the delay time increases, the more it needs shifter devices for counting.

As a result, the conventional precharge signal generator has several problems in that a timing margin of the generator is reduced in case of driving at a high internal clock frequency, and its size and current consumption increase due to the increase of shifters in the signal generator.

SUMMARY OF THE INVENTION

Embodiments of the present invention relate to providing a precharge signal generator for generating a precharge signal by using divided clocks, thereby guaranteeing the timing margin at a high frequency and reducing the device size and current consumption.

In accordance with an aspect of the present invention, there is provided a semiconductor memory device including a drive clock supplier and a signal generator. The drive clock supplier supplies a drive clock which is a 2-division clock of an internal clock, wherein the drive clock synchronizes with a rising edge of the internal clock with which an internal write signal synchronizes. The signal generator counts time corresponding to a write-recovery on the basis of the drive clock, to generate a precharge signal.

In accordance with another aspect of the present invention, there is provided a semiconductor memory device including a divider for dividing a frequency of an internal clock to generate a plurality of divided clocks with different phases; and a precharge signal generator for generating a precharge signal by counting a delay time corresponding to a write-recovery based on one of the plurality of divided clocks, with which an internal write signal synchronizes.

In accordance with still another aspect of the present invention, there is provided a semiconductor memory device including a divider, a selection controller, a drive clock selector, and a signal generator. The divider divides a frequency of an internal clock to generate first and second divided clocks with different phases. The selection controller generates a selection signal with information on whether an internal write signal synchronizes with the first divided clock or the second divided clock. The drive clock selector provides one of the first and the second divided clocks as a drive clock in response to the selection signal. The signal generator produces a precharge signal after a delay time corresponding to the write-recovery from an activation of the internal write signal based on the drive clock.

In accordance with still another aspect of the present invention, there is provided a driving method of a semiconductor memory device including (a) supplying a drive clock, which is a 2-division clock of an internal clock, synchronizing with an edge of the internal clock, with which an internal write signal synchronizes; and (b) generating a precharge signal after a delay time corresponding to a write-recovery from the internal write signal on the basis of the drive clock.

DESCRIPTION OF SPECIFIC EMBODIMENTS

Hereinafter, a preferred embodiment of the present invention will be described in detail with reference to the accompanying drawings so that a person skilled in the art can easily carry out the invention.

Figure 1:
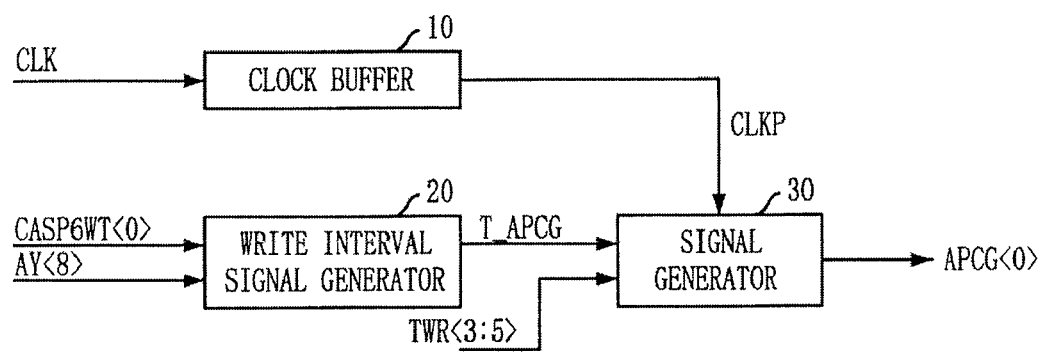
FIG. 1 is a block diagram showing a structure of a conventional precharge signal generator being used in a semiconductor memory device.
Figure 2:
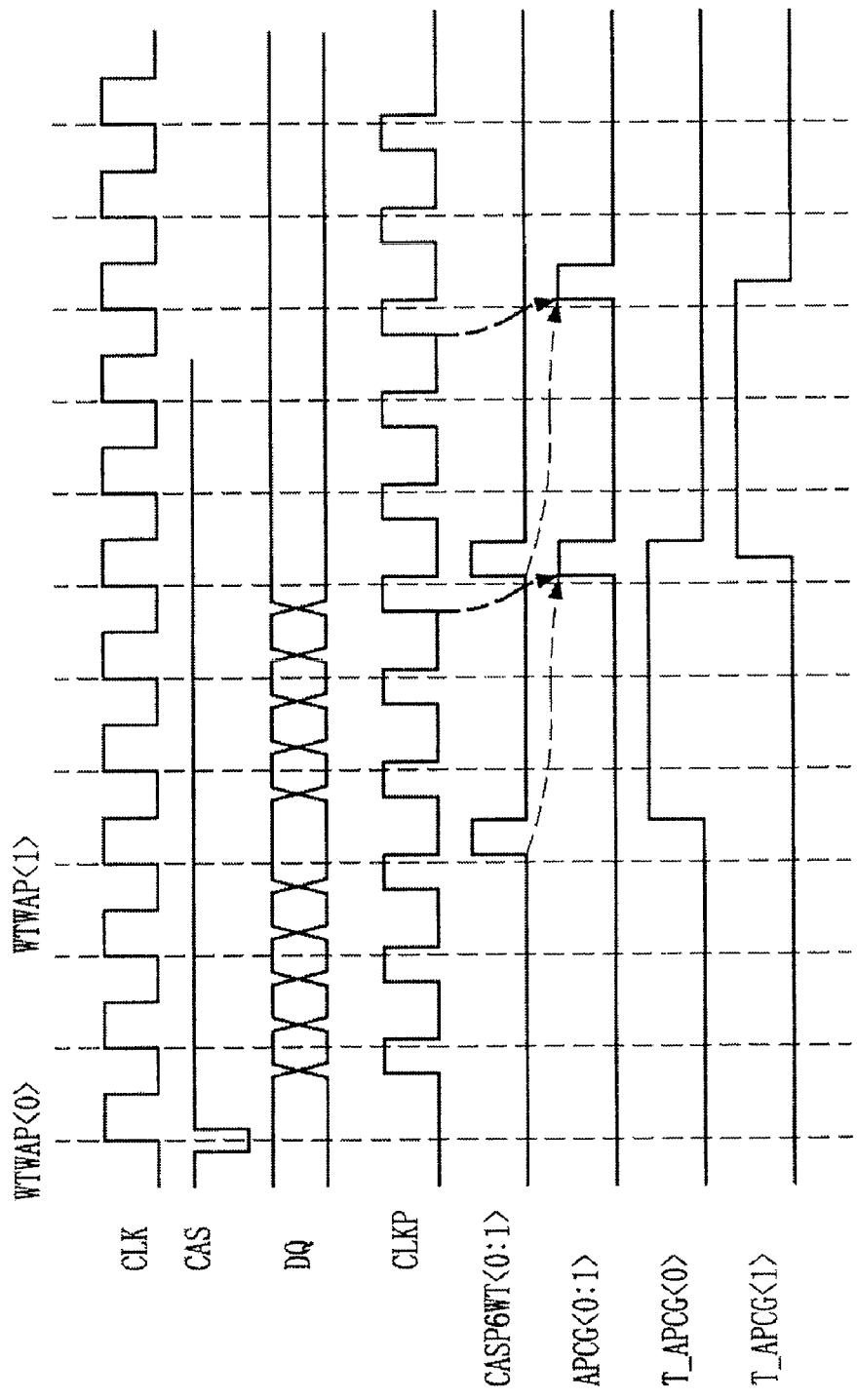
FIG. 2 is a waveform diagram describing the operation of the conventional precharge signal generator shown in FIG. 1.
Figure 3:
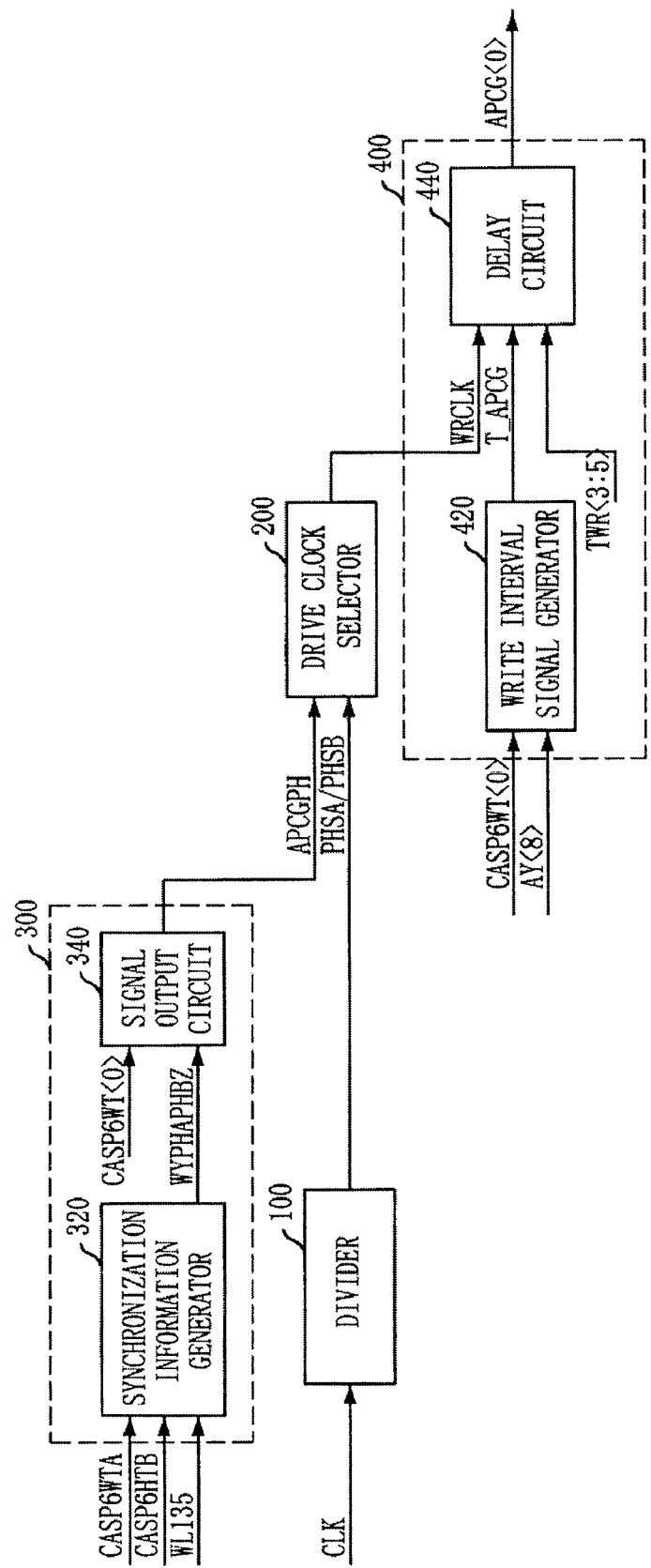
FIG. 3 is a block diagram of a semiconductor memory device having a precharge signal generator in accordance with a preferred embodiment of the present invention.

FIG. 3 illustrates a block diagram of a semiconductor memory device having a precharge signal generator in accordance with a preferred embodiment of the present invention.

Referring to FIG. 3, the semiconductor memory device of the present invention includes a drive clock supplier for supplying a drive clock WRCLK which is a 2-division clock of an internal clock CLK, and a signal generator 400 for counting time corresponding to a write-recovery on the basis of the drive clock WRCLK to generate a precharge signal APCG<0>, wherein the drive clock WRCLK synchronizes with a rising edge of the internal clock CLK with which an internal write signal CASP6WT<0> synchronizes.

The signal generator 400 is provided with a write interval signal generator 420 for receiving the internal write signal CASP6WT<0> and a column address AY<8> and outputting a write interval signal T_APCG, and a delay circuit 440 for generating the precharge signal APCG<0> after a time corresponding to a write-recovery from an activation of the write interval signal T_APCG on the basis of the drive clock WRCLK.

The drive clock supplier is provided with a divider 100 for dividing a frequency of the internal clock CLK to generate a plurality of divided clocks PHSA and PHSB with different phases, and a drive clock output circuit 200 and 300 for outputting one of the plurality of divided clocks PHSA and PHSB, with which the internal write signal synchronizes, as the drive clock WRCLK.

The drive clock output circuit is provided with a selection controller 300 for outputting a selection signal APCGPH with information on whether the internal write signal CASP6WT<0> synchronizes with the first or second divided clock PHSA or PHSB, and a drive clock selector 200 for providing one of the first and the second divided clocks PHSA and PHSB as the drive clock WRCLK depending on a logic level of the selection signal APCGPH.

The selection controller 300 is provided with a synchronization information generator 320 for receiving a first or second synchronization-write signal CASP6WTA or CASP6WTB with information on whether the write command synchronizes with the first or second divided clock PHSA or PHSB, and a write latency-information signal WL135 with information on whether a write latency has an odd clock or an even clock, and outputting a synchronization information signal WYPHAPHBZ, and a signal output circuit 340 for providing the synchronization information signal WYPHAPHBZ as the selection signal APCGPH in response to an activation of the internal write signal CASP6WT<0>.

For reference, the first and the second divided clocks PHSA and PHSB have a frequency which is half of the frequency of the internal clock CLK and have a phase difference of 180 degrees each other.

The internal write signal CASP6WT<0> is a signal which is activated after a delay time corresponding to the write latency from application of the write command made by a combination of plural external signals, and actually controls the write operation within the device.

In another embodiment, the present invention includes a divider 100 for dividing a frequency of an internal clock CLK to generate a plurality of divided clocks PHSA and PHSB with different phases, and a precharge signal generator for generating a precharge signal APCG<0> by counting a delay time corresponding to a write-recovery based on one of the plurality of divided clocks PHSA and PHSB, with which an internal write signal synchronizes. The precharge signal generator is provided with a selection controller 300 for generating a selection signal APCGPH with information on whether the internal write signal CASP6WT<0> synchronizes with the first or second divided clock, a drive clock selector 200 for providing one of the first and the second divided clocks PHSA and PHSB as a drive clock WRCLK in response to the selection signal APCGPH, and a signal generator 400 for outputting the precharge signal APCG<0> after a delay time corresponding to the write-recovery on the basis of the drive clock WRCLK.

As described above, the present invention counts time corresponding to the write-recovery time on the basis of the drive clock WRCLK created by dividing the frequency of the internal clock CLK, to generate the precharge signal. Therefore, although the frequency of the internal clock CLK is high, the timing margin can be secured by the divided drive clock WRCLK, which improves the operation reliability of the semiconductor memory device due to the security of the timing margin, even during the high frequency operation.

Further, since the divided drive clock WRCLK is used, the number of shifters used for counting the delay time corresponding to the write-recovery is small compared with the case of using the internal clock CLK. Accordingly, the device size and current consumption for driving the shifters can be reduced.

The following is a concrete description of an internal circuit of each block shown in FIG. 3.

Figure 4:
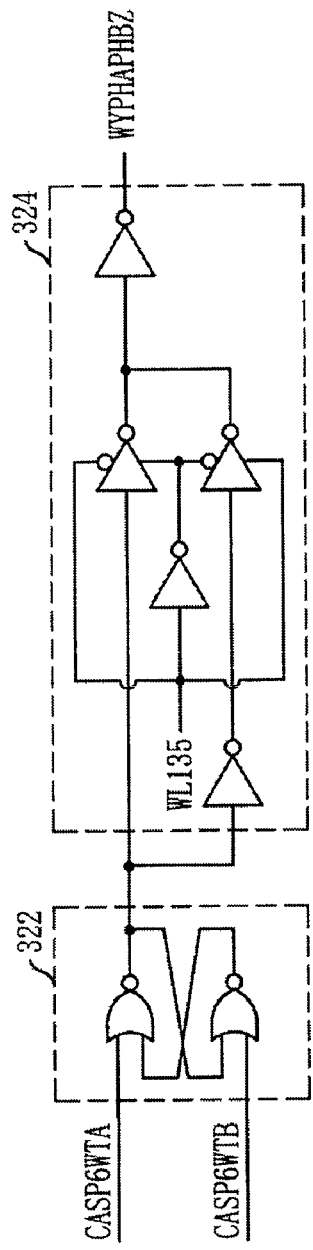
FIG. 4 illustrates an internal circuit of the synchronization information generator shown in FIG. 3.

FIG. 4 illustrates an internal circuit of the synchronization information generator 320 shown in FIG. 3.

Referring to FIG. 4, the synchronization information generator 320 is constituted by an RS latch 322 receiving the first synchronization-write signal CASP6WTA as a set signal and the second synchronization-write signal CASP6WTB as a reset signal, and a selector 324, in response to the write latency-information signal WL135, for providing an output signal of the RS latch 322 or its inverted output signal as the synchronization information signal WYPHAPHBZ.

Briefly explaining an operation, the RS latch 322 activates the output signal to a logic low level if the first synchronization-write signal CASP6WTA is activated to a logic high level, and inactivates it to a logic high level if the second synchronization signal CASP6WTB is activated to a logic high level.

Then, the selector 324 inverts an output signal of the RS latch 322 to output the synchronization information signal WYPHAPHBZ if the write latency-information signal WL135 has a logic high level, and delays the output signal to produce the synchronization information signal WYPHAPHBZ if the write latency-information signal WL135 has a logic low level.

Here, the write latency-information signal WL135 is activated to a logic high level if the write latency has an odd clock and to a logic low level if it has an even clock.

More specifically, the selector 324 inverts the output signal of the RS latch 322 to output the synchronization information signal WYPHAPHBZ if the odd write latency is set, and delays the output signal to output the synchronization information signal WYPHAPHBZ if the even write latency is set.

As mentioned above, if the write-precharge-command is applied in synchronization with the first divided clock PHSA and the first synchronization-write signal CASP6WTA is activated, and the write latency has the even clock and the write latency-information signal WL135 has a logic low level, the synchronization information generator 320 delays the output signal of the RS latch 322 to output the synchronization information signal WYPHAPHBZ of a logic low level. And, if the write latency has the odd clock and the write latency-information signal WL135 has a logic high level, the synchronization information generator 320 inverts the output signal of the RS latch 322 to generate the synchronization information signal WYPHAPHBZ of a logic high level.

The synchronization information generator 320, as described above, receives the information on the clock, with which the write-precharge-command WTWAP synchronizes, and the write latency information, and therefore, the synchronization information signal WYPHAPHBZ has a different logic level depending on whether the internal write signal CASP6WT actually synchronizes with the first or second divided clock PHSA or PHSB. That is, if the internal write signal CASP6WT synchronizes with the first divided clock PHSA, the synchronization information signal WYPHAPHBZ has a logic high level and if it synchronizes with the second divided clock PHSB, the synchronization information signal WYPHAPHBZ has a logic low level.

Figure 5:
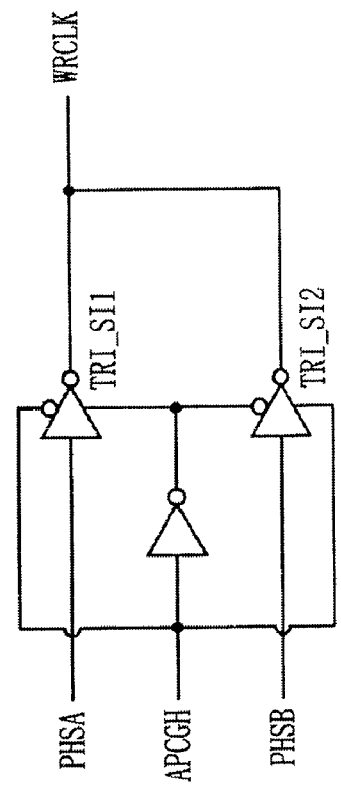
FIG. 5 illustrates an internal circuit of the drive clock selector shown in FIG. 3.

FIG. 5 provides an internal circuit of the drive clock selector 200 shown in FIG. 3.

Referring to FIG. 5, the drive clock selector 200 is constituted by a first three-state inverter TRI-SI1 for inverting the first divided clock PHSA to transfer an inverted clock as the drive clock WRCLK in response to a logic low level of the pulse selection signal APCGPH, and a second three-state inverter TRI-SI2 for inverting the second divided clock PHSB to transfer an inverted clock as the drive clock WRCLK in response to a logic high level of the pulse selection signal APCGPH, the first and the second three-state inverters TRI-SI1 and TRI-SI2 having a common output node.

Roughly explaining an operation, the drive clock selector 200 inverts the first divided clock PHSA to transfer an inverted clock as the drive clock WRCLK when the pulse selection signal APCGPH applied thereto has a logic low level, and inverts the second divided clock PHSB to transfer an inverted clock as the drive clock WRCLK when it has a logic high level.

Figure 6:
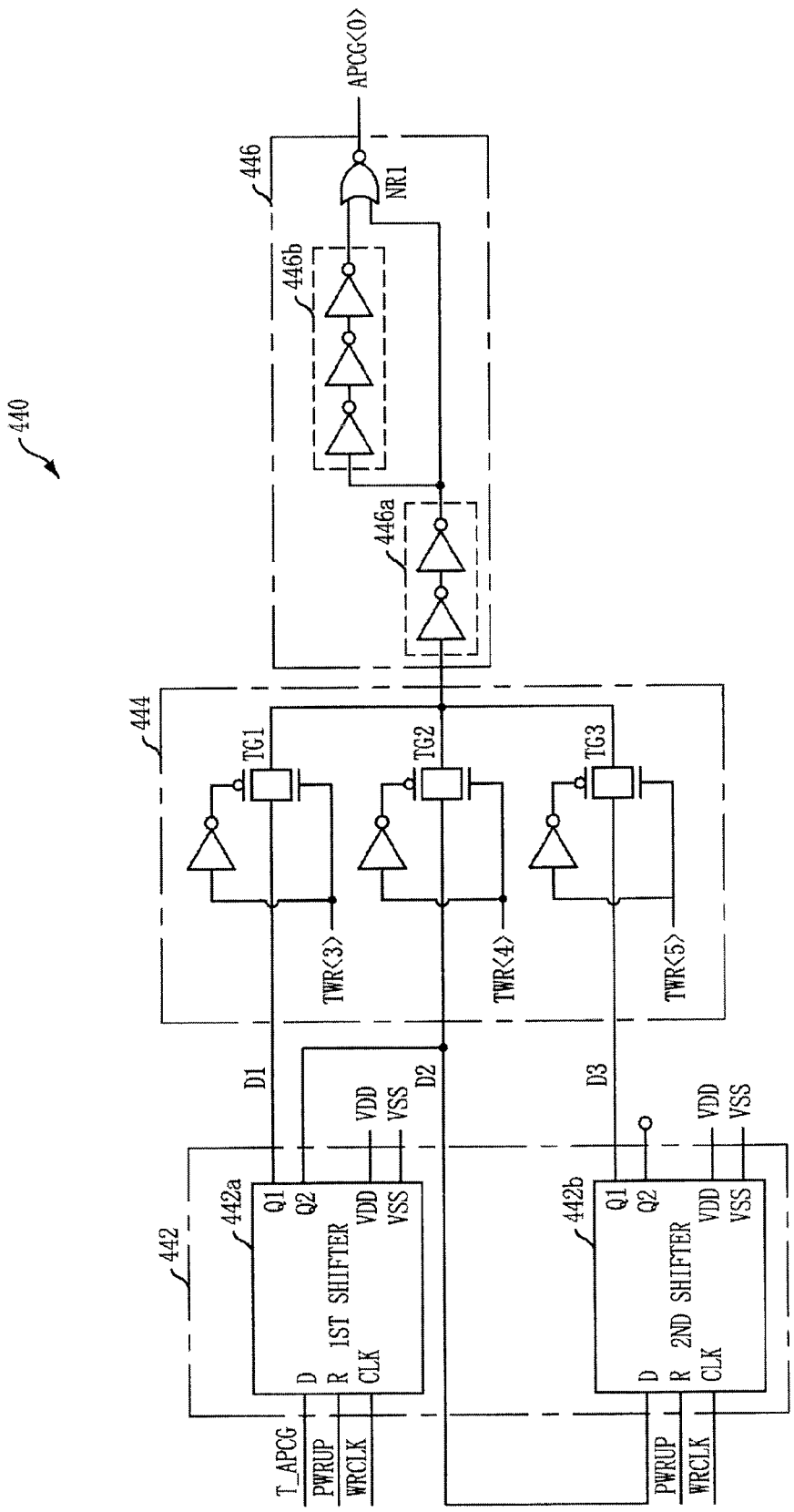
FIG. 6 illustrates an internal circuit of the delay circuit shown in FIG. 3.

FIG. 6 illustrates an internal circuit of the delay circuit 440 shown in FIG. 3.

Referring to FIG. 6, the delay circuit 440 is provided with a shifting circuit 442 for generating a plurality of delayed signals D1, D2 and D3 by delaying the write interval signal T_APCG in half clock units on the basis of the drive clock WRCLK, a signal selector 444 for outputting one of the plurality of delayed signals in response to an activation of a corresponding signal out of the write-recovery-information signals TWR<3:5>, and an edge sensor 446 for expanding an activation interval of an output signal of the signal selector 444 to produce the precharge signal APCG<0>.

The signal selector 444 is constituted by a first transfer gate TG1 for transferring the first delayed signal D1 in response to the first write-recovery-information signal TWR<3>, a second transfer gate TG2 for transferring the second delayed signal D2 in response to the second write-recovery-information signal TWR<4>, and a third transfer gate TG3 for transferring the third delayed signal D3 in response to the third write-recovery-information signal TWR<5>, the third to fifth transfer gates TG1 to TG3 having a common output node.

The edge sensor 446 is constituted by a first inverter chain 446a for delaying and outputting an output signal of the signal selector 444, a second inverter chain 446b for inverting and delaying an output signal of the first inverter chain 446a, and a NOR gate NR1 for taking output signals of the first and the second inverter chains 446a and 446b as its inputs and generating the precharge signal APCG<0>.

The shifting circuit 442 is constituted by a first shifter 442a for providing the first and the second delayed signals D1 and D2 by delaying the write interval signal T_APCG by multiple half clock units on the basis of the drive clock WRCLK, and a second shifter 442b for generating the third delayed signal D3 by delaying the second delayed signal D2 by a half clock on the basis of the drive clock WRCLK.

The first shifter 442a receives the drive clock WRCLK as its clock CLK, a power up signal PWEUP as a reset signal R, and the write interval signal T_APCG as data D. The first shifter 442a outputs a first output signal Q1 created by delaying the data D by a half clock as the first delayed signal D1, and a second output signal Q2 obtained by delaying the data D by one clock as the second delayed signal D2. VDD is a power supply voltage and VSS is a ground voltage.

Now, an operation of the delay circuit 440 will be simply described below.

First, the shifting circuit 442 produces the first to third delayed clocks D1, D2 and D3 by delaying the write interval signal T_APCG by multiple half clock units based on the drive clock WRCLK.

Subsequently, the signal selector 444, in response to an activated signal out of the first to third write-recovery-information signals TWR<3:5>, outputs the corresponding delayed signal. For instance, if the first write-recovery-information signal TWR<3> is activated, the first delayed signal D1 is selected and outputted.

Then, the edge sensor 446 further expands an activation interval of the output signal of the signal selector 444 by a delay time of the second inverter chain 446b, to generate the precharge signal APCG<0>.

In other words, the delay circuit 440 generates the plurality of delayed signals D1, D2 and D3 by delaying the write interval signal T_APCG by multiple half clock units on the basis of the drive clock WRCLK, and then selects the delayed signal with the delay corresponding to the write recovery time, to thereby output it as the precharge signal APCG<0>.

As described above, the delay circuit 440 generates the plurality of delayed signals D1, D2 and D3 by delaying the write interval signal T_APCG by multiple half clock units on the basis of the drive clock WRCLK. This is because the drive clock WRCLK is created by 2-dividing the frequency of the internal clock CLK. Namely, the plurality of delayed signals D1, D2 and D3 which are created by delaying the write interval signal T_APCG by multiple half clock units on the basis of the drive clock WRCLK have a delay of one clock unit each other based on the internal clock CLK. Thus, the signal corresponding to the write-recovery time can be selected and outputted based on the internal clock CLK.

Figure 7:
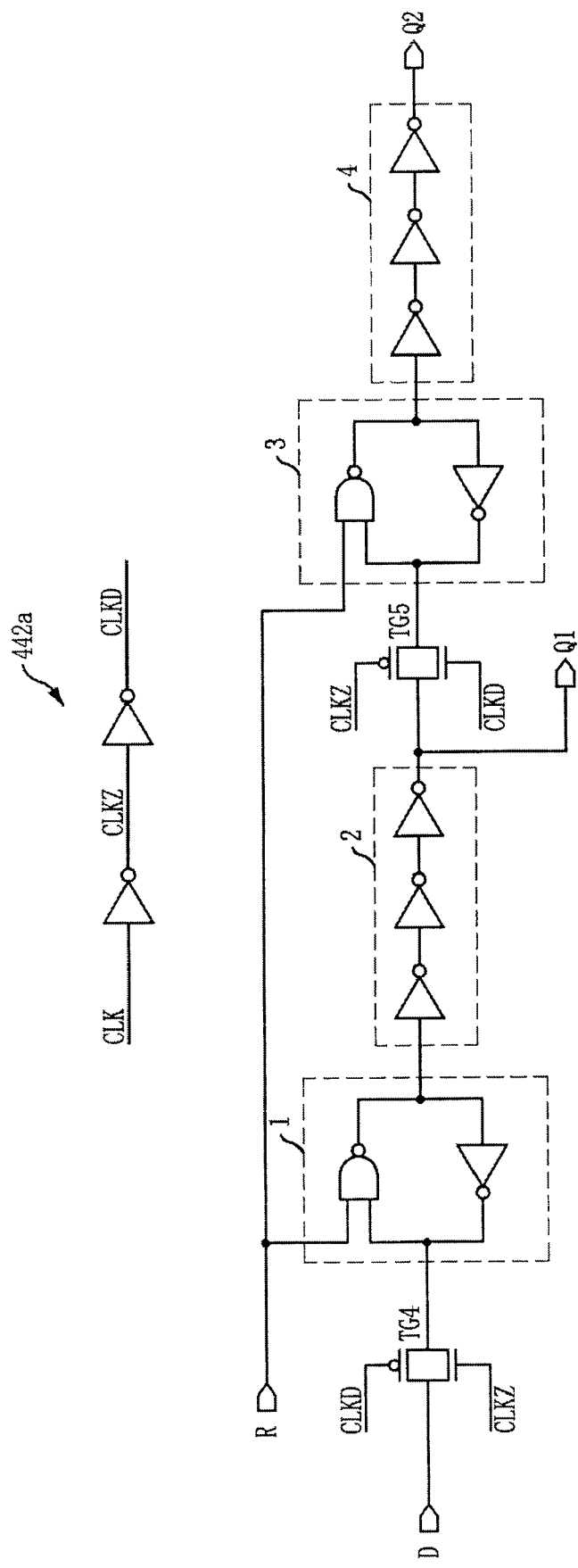
FIG. 7 illustrates an internal circuit of the first shifter shown in FIG. 6.

FIG. 7 illustrates an internal circuit of the first shifter 442a depicted in FIG. 6, wherein since the first and the second shifters 442a and 442b have the same circuit structure, only the first shifter 442a is described here for simplicity. For reference, the first shifter 442a receives the drive clock WRCLK as its clock CLK, a power-up signal PWEUP as a reset signal R, and the write interval signal T_APCG as data D. It outputs a first output signal Q1 created by delaying the data D by a half clock as the first delayed signal D1, and a second output signal Q2 obtained by delaying the data D by one clock as the second delayed signal D2.

Referring to FIG. 7, the first shifter 442a is provided with a clock delay circuit 5 for generating an inverted clock CLKZ and a delayed clock CLKD of the clock CLK, a first transfer gate TG4 for transferring the data D in response to a logic low level of the delayed clock CLKD, a first latch 1 for initializing its output signal, or inverting and latching an output signal of the first transfer gate TG4 in response to the reset signal R, a first inverter chain 2 for inverting and delaying an output signal of the first latch 1 to output the first output signal Q1, a second transfer gate TG5 for transferring an output signal of the first inverter chain 2 in response to a logic low level of the inverted clock CLKZ, a second latch 3 for initializing its output signal, or inverting and latching an output signal of the second transfer gate TG5 in response to the reset signal R, and a second inverter chain 4 for inverting and delaying an output signal of the second latch 3 to generate the second output signal Q2.

As set forth above, on the basis of the drive clock WRCLK, the first shifter 442a provides the first delayed signal D1 by delaying the data D by a half clock, and the second delayed signal D2 by delaying it by one clock. Further, if the power-up signal PWRUP is activated, it inactivates the first and the second delayed signals D1 and D2.

For reference, the first shifter 442a can control the operation of the first and the second transfer gates TG4 and TG5 by using the drive clock WRCLK, without going through the clock delay circuit 5.

Figure 8:
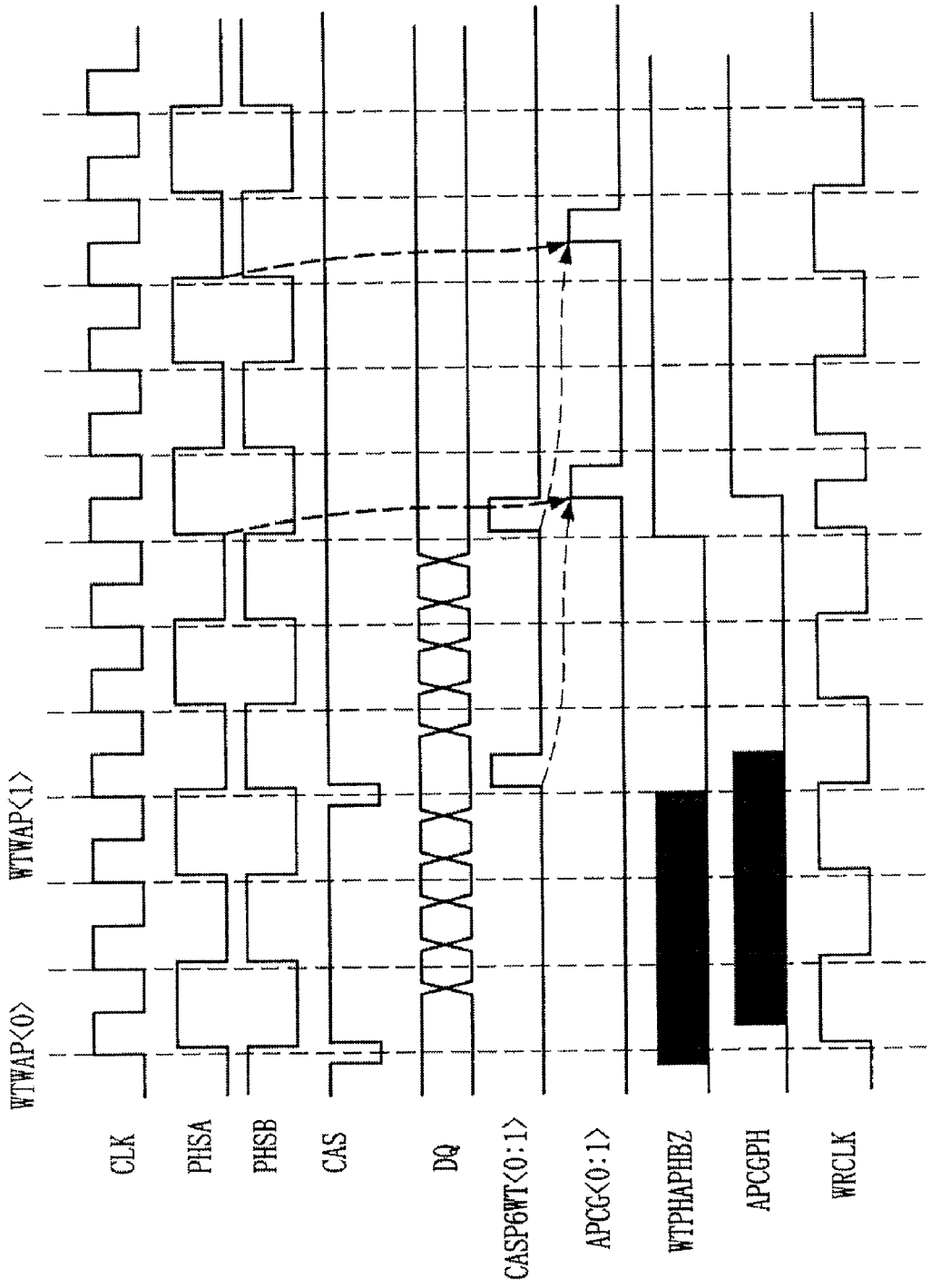
FIG. 8 is a waveform diagram describing the operation of the precharge signal generator in accordance with the present invention shown in FIGS. 3 to 7.

FIG. 8 is a waveform diagram describing the operation of the precharge signal generator in accordance with the present invention as shown in FIGS. 3 to 7, wherein the operation will be described with reference to FIG. 8 below.

First, the divider 100 divides the internal clock CLK to generate the first and the second divided clocks PHSA and PHSB with different phases. That is, the period of each of the first and the second divided clocks PHSA and PHSB is twice that of the internal clock CLK, the divided clocks having a phase difference of 180 degrees each other.

Meanwhile, a write-precharge-command WTWAP<0> synchronizes with the internal clock CLK, and is inputted, particularly in synchronization with the first divided clock PHSA. Thus, the first synchronization-write signal CASP6WTA is activated to a logic high level and the second synchronization-write signal CASP6WTB is inactivated to a logic low level.

Thereafter, the internal write signal CASP6WT becomes activated after a delay time of three clocks corresponding to the write latency. At this time, the internal write signal CASP6WT synchronizes with a rising edge of the second divided clock PHSB.

Then, the synchronization information generator 320 outputs the synchronization information signal WYPHAPHBZ of a logic low level in response to an activation of the first synchronization-write signal CASP6WTA and the write latency-information signal WL135. And, the signal output circuit 340, in response to the internal write signal CASP6WT<0>, outputs the synchronization information signal WYPHAPHBZ as the selection signal APCGPH. At this time, the selection signal has a logic low level.

Next, the clock selector 200 chooses the second divided clock PHSB and provides it as the drive clock WRCLK in response to the selection signal APCGPH of a logic low level. Thus, the drive clock has the same phase as the second divided clock PHSB.

Further, the write interval signal generator 420 activates the write interval signal T_APCG to a logic high level in response to the internal write signal CASP6WT<0> and an activation of the column address AY<8>.

In succession, the delay circuit 440 generates the precharge signal APCG<0> after a delay time of three clocks corresponding to the write-recovery from the activation of the write interval signal T_APCG on the basis of the drive clock WRCLK.

Meanwhile, a new write-precharge-command WTWAP<1> synchronizes with the internal clock CLK, and is applied, particularly in syncrhonization with the second divided clock PHSB. Thus, the first synchronization-write signal CASP6WTA is inactivated to a logic low level and the second synchronization-write signal CASP6WTB is activated to a logic high level.

Subsequently, the internal write signal CASP6WT becomes activated after a delay time of three clocks corresponding to the write latency. At this time, the internal write signal CASP6WT synchronizes with a rising edge of the first divided clock PHSA.

Then, the synchronization information generator 320 outputs the synchronization information signal WYPHAPHBZ of a logic high level in response to an activation of the second synchronization-write signal CASP6WTB and the write latency-information signal WL135. And, the signal output circuit 340, in response to the internal write signal CASP6WT<0>, provides the synchronization information signal WYPHAPHBZ as the selection signal APCGPH. At this time, the selection signal has a logic high level.

Next, the clock selector 200 chooses the first divided clock PHSA and outputs it as the drive clock WRCLK in response to the selection signal APCGPH of a logic high level. Therefore, as shown in the drawing, the selection signal APCGPH is transited, and thus, the phase of the drive clock WRCLK is changed.

In succession, the signal generator 400 generates the precharge signal APCG<1> three clocks after the write-recovery time based on the drive clock WRCLK in response to the internal write signal CASP6WT<0> and the column address AY<8>.

For reference, the write-precharge-command is applied with a combination of external signals such as RAS, CAS, ET, etc.

Further, the internal write signal CASP6WT is activated after a delay time corresponding to the write latency from an application of the write-precharge-command or write command, and actually enables the write operation within the device.

The precharge signal APCG should be activated after the write latency and write-recovery time are guaranteed from the application of the write-precharge-command or write command so that there is no failure of data applied for the write operation.

Meanwhile, the semiconductor memory device including the precharge signal generator as mentioned above counts the write-recovery time on the basis of the drive clock created by dividing the internal clock, and thus can secure the timing margin although the frequency of the internal clock is high.

Further, in case of counting a same amount of time like the write-recovery time, the number of shifters to be prepared changes depending on the frequency of a reference clock. In other words, the number of shifters provided in one clock unit based on the drive clock according to the present invention is less than that of shifters in one clock unit based on the internal clock according to the prior art. Thus, the present invention can reduce the device size by shifters and current consumption by their driving.

As a result, the present invention as set forth above generates the precharge signal by using the divided clocks, thereby guaranteeing the timing margin at a high frequency and reducing the device size and current consumption.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
    a selection signal generator configured to receive an internal write signal and generate a selection signal;
    a clock divider configured to receive and divide an internal clock and generate a plurality of divided clocks;
    a drive clock supplier configured to supply one of the plurality of divided clocks as a drive clock in response to the selection signal, wherein the selection signal indicates which one of the plurality of divided clocks is synchronized with the internal write signal;
    a write interval signal generator configured to receive the internal write signal and a column address and generate a write interval signal; and
    a signal generator configured to determine a delay time corresponding to a write-recovery time in response to the drive clock supplied from the drive clock supplier and a write-recovery information signal representing the write-recovery time and to generate a precharge signal by delaying the write interval signal for the delay time.

2. The semiconductor memory device as recited in claim 1, wherein the internal write signal is activated after a delay time corresponding to a write latency period from application of a write command.

3. The semiconductor memory device as recited in claim 2, wherein the plurality of divided clocks include first and second divided clocks of which frequencies are half of a frequency of the internal clock and have a phase difference of 180 degrees with each other.

4. The semiconductor memory device as recited in claim 3, wherein the selection signal generator includes:
    a synchronization information generator configured to receive first or second synchronization-write signal representing whether the write command synchronizes with the first divided clock or the second divided clock and a write latency-information signal representing whether the write latency period corresponds to an odd clock or an even clock, and output a synchronization information signal;
    a signal output circuit configured to provide the synchronization information signal as the selection signal in response to an activation of the internal write signal.

5. The semiconductor memory device as recited in claim 4, wherein the synchronization information generator includes:
    an RS latch configured to receive the first synchronization-write signal as a set signal and the second synchronization-write signal as a reset signal; and
    a selector configured to, in response to the write latency-information signal, invert an output signal of the RS latch if the write latency period corresponds to an odd clock, delay the output signal of the RS latch if the write latency period corresponds to an even clock, and provide the inverted signal or the delayed signal as the synchronization information signal.

6. The semiconductor memory device as recited in claim 5, wherein the signal generator includes
    a delay circuit configured to generate a plurality of delayed signals, which are delayed by multiple half clock units from an activation of the write interval signal by using the drive clock, select one of the delayed signals having a delay time corresponding to the write-recovery time, and output the selected delayed signal as the precharge signal.

7. The semiconductor memory device as recited in claim 6, wherein the internal write signal controls a write operation of the semiconductor memory device.

8. The semiconductor memory device as recited in claim 6, wherein the delay circuit includes:
    a shifting circuit configured to produce the plurality of delayed signals by delaying the write interval signal by multiple half clock units based on the drive clock;
    a signal selector configured to provide one of the plurality of delayed signals in response to the write-recovery-information signals; and
    an edge sensor configured to expand an activation interval of an output signal of the signal selector and generate the precharge signal.

9. A semiconductor memory device comprising:
    a divider configured to divide an internal clock to generate first and second divided clocks with different phases; and a selection controller configured to generate a selection signal representing whether an internal write signal synchronizes with the first divided clock or the second divided clock;
a drive clock selector configured to provide one of the first and the second divided clocks as a drive clock in response to the selection signal; and
a signal generator configured to generate a write interval signal based on the internal write signal and a column address and produce a precharge signal by delaying the write interval signal for a delay time corresponding to a write-recovery time from an activation of the internal write signal based on the drive clock.

10. The semiconductor memory device as recited in claim 9, wherein the first and second divided clocks have frequencies which are half of a frequency of the internal clock and have a phase difference of 180 degrees with each other.

11. The semiconductor memory device as recited in claim 10, wherein the internal write signal controls a write operation of the semiconductor memory device and is activated after a delay time corresponding to a write latency period from an application of a write command.

12. The semiconductor memory device as recited in claim 11, wherein the selection controller includes:
a synchronization information generator configured to receive first or second synchronization-write signal representing whether the write command synchronizes with the first divided clock or the second divided clock, and a write latency-information signal representing whether the write latency period corresponds to an odd clock or an even clock, and generating a synchronization information signal; and
a signal output circuit configured to provide the synchronization information signal as the selection signal in response to an activation of the internal write signal.

13. The semiconductor memory device as recited in claim 12, wherein the signal generator includes:
a write interval signal generator configured to receive the internal write signal and the column address and produce the write interval signal; and
a delay circuit configured to generate the precharge signal by delaying the write interval signal for the delay time corresponding to the write-recovery time from an activation of the write interval signal based on the drive clock.

14. The semiconductor memory device as recited in claim 13, wherein the delay circuit includes:
a shifting circuit configured to generate a plurality of delayed signals by delaying the write interval signal by multiple half clock units based on the drive clock;
a signal selector configured to output one of the plurality of delayed signals in response to a write-recovery-information signal representing the write-recovery time; and
an edge sensor configured to expand an activation interval of an output signal of the signal selector and produce the precharge signal.

15. The semiconductor memory device as recited in claim 14, wherein the shifting circuit includes:
a first shifter configured to provide first and second delayed signals by delaying the write interval signal by multiple half clock units based on the drive clock; and
a second shifter configured to generate a third delayed signal by delaying the second delayed signal by a half clock based on the drive clock.

16. The semiconductor memory device as recited in claim 15, wherein the first shifter includes:

a first transfer gate configured to transfer the write interval signal in response to a first logic level of the drive clock;
a first latch configured to initialize its output signal, or invert and latch an output signal of the first transfer gate in response to a power-up signal;
a first inverter chain configured to inverting and delay an output signal of the first latch to generate the first delayed signal;
a second transfer gate configured to transfer an output signal of the first inverter chain in response to a second logic level of the drive clock;
a second latch configured to initialize its output signal, or invert and latch an output signal of the second transfer gate in response to the power-up signal; and
a second inverter chain configured to invert and delay an output signal of the second latch, to provide the second delayed signal.

17. The semiconductor memory device as recited in claim 16, wherein the synchronization information generator includes:
an RS latch configured to receive the first synchronization-write signal as a set signal and the second synchronization-write signal as a reset signal; and
a selector, in response to the write latency-information signal, configured to invert an output signal of the RS latch if the write latency period has an odd clock, delay the output signal of the RS latch if the write latency has an even clock, and provide the inverted signal or the delayed signal as the synchronization information signal.

18. The semiconductor memory device as recited in claim 16, wherein the edge sensor includes:
a third inverter chain configured to delaying an output signal of the signal selector;
a fourth inverter chain configured to invert and delay an output signal of the third inverter chain; and
a NOR gate configured to receive output signals of the third and fourth inverter chains as its inputs and generating the precharge signal by NORing the output signals of the third and fourth inverter.

19. The semiconductor memory device as recited in claim 18, wherein the signal selector includes:
a third transfer gate configured to transfer the first delayed signal in response to a first write-recovery-information signal;
a fourth transfer gate configured to transfer the second delayed signal in response to a second write-recovery-information signal; and
a fifth transfer gate configured to transfer the third delayed signal in response to a third write-recovery-information signal,
wherein the third to fifth transfer gates have a common output node to provide the first to third delayed signals.

20. The semiconductor memory device as recited in claim 19, wherein the drive clock selector includes:
a first three-state inverter configured to transfer the first divided clock as the drive clock in response to a first logic level of the selection signal; and
a second three-state inverter configured to transfer the second divided clock as the drive clock in response to a second logic level of the selection signal,
wherein the first and the second three-state inverters have a common output node.

21. A driving method of a semiconductor memory device, comprising:
dividing an internal clock into first and second divided clocks each having a different phase;

supplying one of the first and second divided clocks as a drive clock based on an internal write signal; and generating a write interval signal based on the internal write signal and a column address;

generating a precharge signal by delaying the write interval signal for a delay time corresponding to a write-recovery time from the internal write signal based on the drive clock.

22. The driving method as recited in claim 21, wherein the internal write signal controls a write operation of the semiconductor device and is activated after a delay time corresponding to a write latency period from an application of a write command.

23. The driving method as recited in claim 22, wherein the supplying the drive clock includes selecting one of the first and second divided clocks, wherein the selected one is synchronized with the internal write signal, as the drive clock.

24. The driving method as recited in claim 23, wherein the first and second divided clocks have frequencies that are half of frequency of the internal clock and have a phase difference of 180 degrees each other.

25. The driving method as recited in claim 24, wherein the selecting one of the first and second divided clocks includes:

generating a first or second synchronization-write signal representing whether the write command synchronizes with a rising edge of the first divided clock or with a rising edge of the second divided clock;

if a write latency period corresponds to an odd clock, inverting the first or second synchronization-write signal being applied, and if the write latency period corresponds to an even clock, delaying the first or second synchronization-write signal being applied, to provide an inverted or delayed signal as a selection signal; and selecting one of the first and the second divided clocks as the drive clock in response to the selection signal.

* * * * *